United States Patent
Mun et al.

(10) Patent No.: US 9,389,452 B2
(45) Date of Patent: Jul. 12, 2016

(54) ELECTROSTATIC MEMBER IN FORMING TOUCH DISPLAY APPARATUS AND METHOD OF MANUFACTURING THE SAME

(71) Applicant: Samsung Display Co., Ltd., Yongin, Gyeonggi-Do (KR)

(72) Inventors: Sung-Jin Mun, Seoul (KR); Dae-Cheol Kim, Hwaseong-si (KR); Woong-Kwon Kim, Cheonan-si (KR); Sung-Ryul Kim, Asan-si (KR); Ki-Hun Jeong, Cheonan-si (KR); Byeong-Hoon Cho, Seoul (KR); Jung-Suk Bang, Guri-si (KR); Kun-Wook Han, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 199 days.

(21) Appl. No.: 14/065,686

(22) Filed: Oct. 29, 2013

(65) Prior Publication Data
US 2014/0247403 A1 Sep. 4, 2014

(30) Foreign Application Priority Data
Mar. 4, 2013 (KR) .................. 10-2013-0022707

(51) Int. Cl.
*G02F 1/1333* (2006.01)
*H01L 27/32* (2006.01)
*G02F 1/1362* (2006.01)
*H01L 27/146* (2006.01)
*G02F 1/133* (2006.01)
*G06F 3/041* (2006.01)
*G06F 3/042* (2006.01)

(52) U.S. Cl.
CPC ...... *G02F 1/13338* (2013.01); *G02F 1/136204* (2013.01); *G02F 1/136209* (2013.01); *H01L 27/323* (2013.01); *G02F 2001/13312* (2013.01); *G02F 2202/10* (2013.01); *G02F 2203/11* (2013.01); *G06F 3/042* (2013.01); *G06F 3/0412* (2013.01); *G06F 2203/04103* (2013.01); *H01L 27/14678* (2013.01); *H01L 2227/323* (2013.01)

(58) Field of Classification Search
CPC ................. G06F 3/0412; G09G 5/003; G09G 2300/0421; G02F 1/133305; G02F 1/133707; G02F 1/13452; G02F 1/167
See application file for complete search history.

(56) References Cited

U.S. PATENT DOCUMENTS

| 7,763,497 B2 | 7/2010 | Neaves |
| 8,232,625 B2 | 7/2012 | Voldman |

(Continued)

FOREIGN PATENT DOCUMENTS

| JP | 08-243084 A | 9/1996 |
| JP | 3148979 B2 | 1/2001 |

(Continued)

*Primary Examiner* — Huyen Ngo
(74) *Attorney, Agent, or Firm* — Cantor Colburn LLP

(57) ABSTRACT

A touch display apparatus includes a base substrate, a light blocking semiconductor pattern disposed on the base substrate and configured to block a visible light and transmit an infrared light, a sensing element disposed on the light blocking semiconductor pattern and configured to detect a touch position using an incident infrared light, a driving element configured to drive the sensing element, a signal line electrically connected with the sensing element or the driving element, and a wiring connecting part disposed under the signal line and including a same material as the light blocking semiconductor pattern.

12 Claims, 10 Drawing Sheets

(56) References Cited

U.S. PATENT DOCUMENTS

| | | | |
|---|---|---|---|
| 8,780,063 B2* | 7/2014 | Kim | G06F 3/045 345/107 |
| 2008/0204618 A1 | 8/2008 | Jung et al. | |
| 2011/0050625 A1 | 3/2011 | Kim et al. | |
| 2012/0154308 A1* | 6/2012 | Jeon | G02F 1/13338 345/173 |
| 2012/0188204 A1* | 7/2012 | Yeo | G06F 3/042 345/175 |
| 2012/0326973 A1* | 12/2012 | Kita | G06F 3/042 345/156 |
| 2013/0056732 A1* | 3/2013 | Jung | G06F 3/042 257/53 |

FOREIGN PATENT DOCUMENTS

| | | |
|---|---|---|
| KR | 1020080011855 A | 2/2008 |
| KR | 1020080018720 A | 2/2008 |
| KR | 1020080046891 A | 5/2008 |
| KR | 0999082 | 12/2010 |

* cited by examiner

ELECTROSTATIC MEMBER IN FORMING TOUCH DISPLAY APPARATUS AND METHOD OF MANUFACTURING THE SAME

This application claims priority to Korean Patent Application No. 10-2013-0022707, filed on Mar. 4, 2013, and all the benefits accruing therefrom under 35 U.S.C. §119, the contents of which are incorporated by reference herein in its entirety.

BACKGROUND

1. Field

Exemplary embodiments of the invention relate to a touch display apparatus and a method of manufacturing the touch display apparatus. More particularly, exemplary embodiments of the invention relate to a touch display apparatus capable of reducing or effectively preventing electrostatic charges during a manufacture thereof and a method of manufacturing the touch display apparatus.

2. Description of the Related Art

A flat display device having some advantages in dimension and weight, such as a liquid crystal display or an organic electro luminescence display, has been developed.

In manufacturing the flat display apparatus, most processes are performed on a substrate, such as a glass substrate. Since the substrate is a nonconductor of electricity, a suddenly generated electric charge is not rapidly discharged, so that the substrate is extremely vulnerable to electrostatic charges. Accordingly, an insulation layer, a thin film transistor or an emitting element disposed on the substrate may be damaged by the electrostatic charges. In addition, where a flat display apparatus includes a touch panel, a defect in a signal line may occur from electrostatic charges generated at an input end of a gate connected to the signal line when a sensor in the touch panel is driven.

SUMMARY

One or more exemplary embodiment of the invention provides a touch display apparatus capable of reducing or effectively preventing electrostatic charges during a manufacture thereof.

One or more exemplary embodiment of the invention also provides a method of manufacturing the touch display apparatus.

In an exemplary embodiment of a display substrate according to the invention, the display substrate includes a base substrate, a light blocking semiconductor pattern disposed on the base substrate and configured to block a visible light and transmit an infrared light, a sensing element disposed on the light blocking semiconductor pattern and configured to detect a touch position using an incident infrared light, a driving element configured to drive the sensing element, a signal line electrically connected with the sensing element or the driving element and extending in a direction, and a wiring connecting part disposed under the signal line and including a same material as that of the light blocking semiconductor pattern.

In an exemplary embodiment, the light blocking semiconductor pattern may include an amorphous silicon germanium.

In an exemplary embodiment, the sensing element may include a semiconductor pattern disposed on the light blocking semiconductor pattern, a source electrode overlapped with a first end of the semiconductor pattern, a drain electrode spaced apart from the source electrode and overlapped with a second end of the semiconductor pattern opposing the first end, and a gate electrode disposed on the source electrode and the drain electrode.

In an exemplary embodiment, the wiring connecting part may include amorphous silicon germanium.

In an exemplary embodiment, the light blocking semiconductor pattern and the wiring connecting part may be in a same layer.

In an exemplary embodiment of a method of manufacturing touch display apparatus, the method includes providing a semiconductor layer on a base substrate, the semiconductor layer including: a light blocking semiconductor pattern configured to block a visible light and transmit an infrared light, a wiring connecting part in a display area of the apparatus and including a same material as that of the light blocking semiconductor pattern, and a guard ring in a peripheral area of the apparatus and connected with the wiring connecting part; providing a metal pattern including a signal line on the wiring connecting part and lengthwise extending in a direction; and providing a sensing element on the metal pattern, and configured to detect a touch position using an incident infrared.

In an exemplary embodiment, the providing the sensing element may include providing a semiconductor pattern on the light blocking semiconductor pattern; providing a source electrode and a drain electrode on the semiconductor pattern; providing an insulation layer on the source electrode and the drain electrode; and providing a gate electrode on the insulation layer.

In an exemplary embodiment, the semiconductor layer may include amorphous silicon germanium.

In an exemplary embodiment, the metal pattern may further include a common voltage wiring disposed in the peripheral area and extending in a direction crossing the signal line and a pad part disposed in the peripheral area and spaced apart from the signal line.

In an exemplary embodiment, the wiring connecting part may connect the guard ring with the signal line and may connect the guard ring with the pad part.

In an exemplary embodiment, the providing the insulation layer may include partially removing the guard ring and the wiring connecting part.

In an exemplary embodiment, the method of manufacturing touch display apparatus may further include providing a connecting electrode connecting the signal line and the pad part to each other, and the connecting electrode and the gate electrode may be in a same layer.

In another exemplary embodiment of a method of manufacturing touch display apparatus, the method includes providing a semiconductor layer on a base substrate, the semiconductor layer including: a light blocking semiconductor pattern configured to block a visible light and transmit an infrared light, and a wiring connecting part in a display area of the apparatus and including a same material as that of the light blocking semiconductor pattern; providing a metal pattern including a signal line on the wiring connecting part and lengthwise extending in a direction; and providing a sensing element on the metal pattern, and configured to detect a touch position using an incident infrared light.

In an exemplary embodiment, the providing the sensing element may include providing a semiconductor pattern on the light blocking semiconductor pattern; providing a source electrode and a drain electrode on the semiconductor pattern; providing an insulation layer on the source electrode and the drain electrode; and providing a gate electrode on the insulation layer.

In an exemplary embodiment, the semiconductor layer may include amorphous silicon germanium.

In an exemplary embodiment, wherein the metal pattern may include a common voltage wiring disposed in the peripheral area and extending in a direction crossing the signal line and a pad part disposed in the peripheral area and spaced from the signal line.

In an exemplary embodiment, the wiring connecting part may connect the signal line with the pad part.

In an exemplary embodiment, the providing the insulation layer may include partially removing the wiring connecting part.

In an exemplary embodiment, the method of manufacturing touch display apparatus may further include providing a connecting electrode connecting the signal line and the pad part to each other, and the connecting electrode may be in a same layer as the gate electrode.

In an exemplary embodiment, wiring connecting part may be provided between the signal line and the pad part and spaced apart from the signal line and the pad part.

According to one or more exemplary embodiment of the invention, generation of an electrostatic charge between the gate line and the pad part using the guard ring and the wiring connecting part including a band pass filter material may be reduced or effectively prevented, so that a quality of display may be improved.

In addition, since the guard ring includes a band pass filter material, the guard ring may be removed easily during manufacturing of the touch display apparatus and damage to the gate line may be reduced or effectively prevented.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
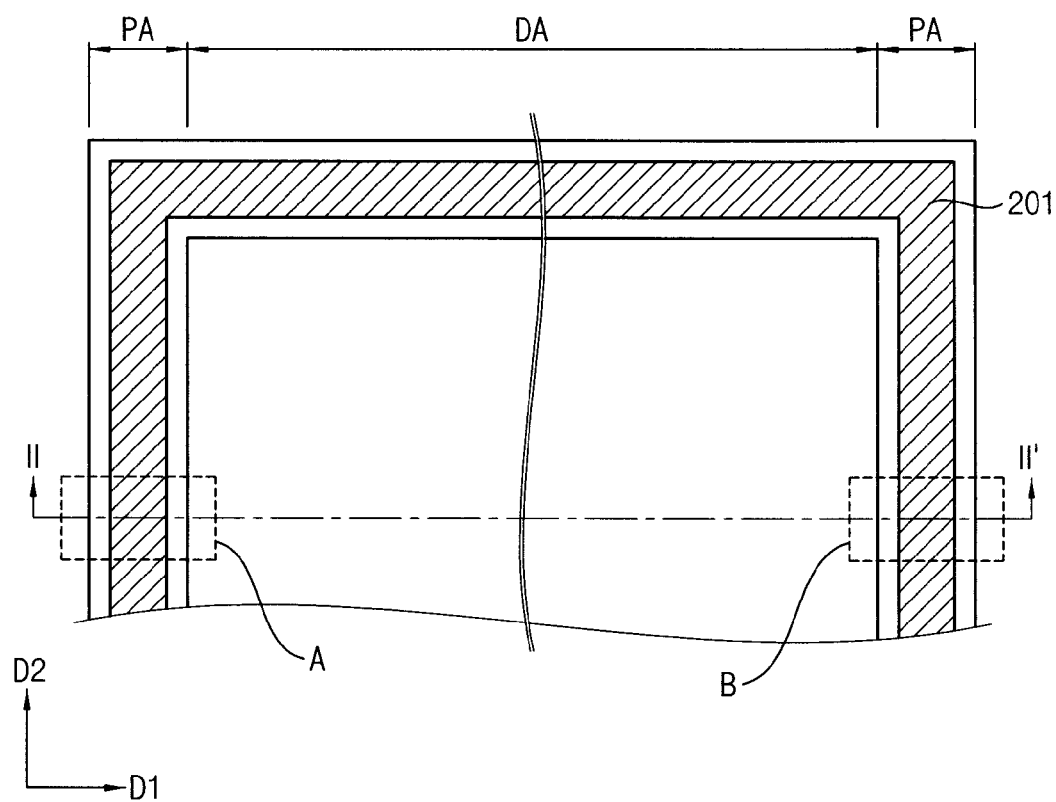
FIG. 1 is a plan view illustrating a portion of an exemplary embodiment of a touch display apparatus with a guard ring according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "under," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In order to reduce or effectively prevent electrostatic charges applied to a non-conductive substrate or a signal line, an antistatic wiring has been used. The antistatic wiring is a bundle of a plurality of signal lines, such as scan lines or data lines at an end of the scan lines and the data lines, respectively. Before driving a flat display apparatus, the antistatic wiring is disconnected from signal lines such as by cutting. For the bundle of signal lines, a guard ring which binds the signal lines has been used. However, in a conventional electrostatic preventing method, a metal is exposed, so that the metal may be undesirably corroded. And, in the process of removing the guard ring, the signal lines may be damaged, so that a quality of the flat display apparatus may be deteriorated.

Hereinafter, the invention will be explained in detail with reference to the accompanying drawings.

Figure 2:
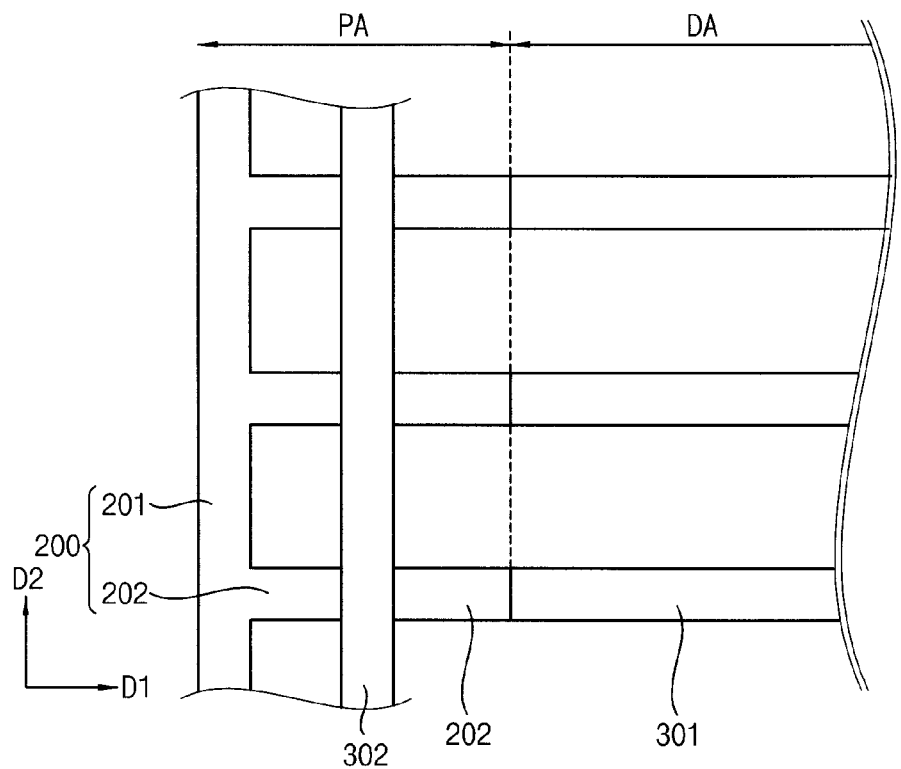
FIG. 2 is an enlarged plan view of portion "A" of FIG. 1.
Figure 3:
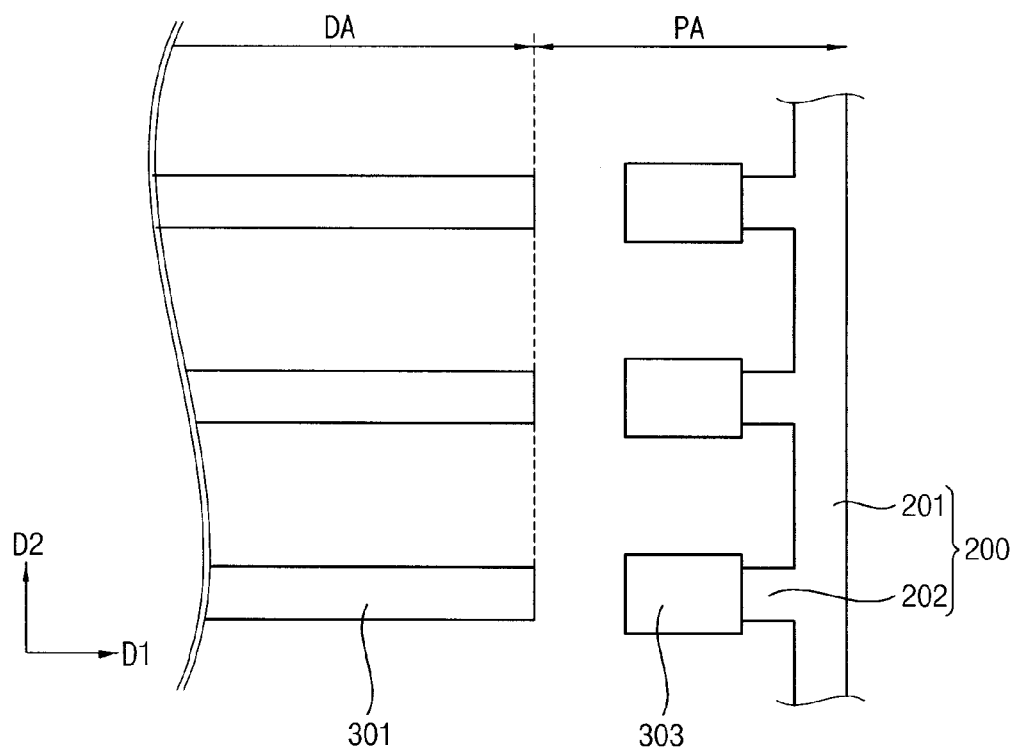
FIG. 3 is an enlarged plan view of portion "B" of FIG. 1.

FIG. 1 is a plan view illustrating an exemplary embodiment of a touch display apparatus with a guard ring according to the invention. FIG. 2 is an enlarged plan view illustrating portion "A" of FIG. 1. FIG. 3 is an enlarged plan view illustrating portion "B" of FIG. 1.

Referring to FIG. 1, a guard ring formed (e.g., provided) on a substrate during a process of manufacturing an exemplary embodiment of a touch display apparatus according to the invention, is represented. The guard ring is disposed in a peripheral area PA of a display panel of the touch display apparatus to have a substantially rectangular shape surrounding a display area DA of the display panel. The guard ring is removed during a subsequent process of manufacturing the touch display apparatus, so that the final touch display apparatus does not include the guard ring. In the display area DA, a switching or driving element such as a thin film transistor may be formed.

Referring to FIGS. 2 and 3, the exemplary embodiment of the touch display apparatus includes one or more of a semiconductor layer 200, a gate line 301, a common voltage wiring 302 and a pad part 303. The semiconductor layer 200 includes a guard ring 201 and a wiring connecting part 202. The guard ring 201 may have a substantially rectangular shape surrounding the display area DA of the display panel.

The common voltage wiring 302 may be disposed in the peripheral area PA and lengthwise extend in a second extension direction. The gate line 301 may be disposed in the display area DA and lengthwise extend in a first extension direction which crosses the extension direction.

Although the guard ring 201 does not remain in the final touch display apparatus, the guard ring 201 is formed to be used in a manufacturing process of the touch display apparatus. The guard ring 201 may be formed to have the substantially rectangular shape surrounding the display area DA of the display panel to remove an electrical potential difference between the gate line 301 and the pad part 303. The guard ring 201 may include a band pass filter material, but is not limited thereto or thereby. The band pass filter material is disposed in an area in which a metal pattern is disposed, to function as a light blocking pattern for blocking a visible light. In addition, the band pass filter material is disposed in an area in which a semiconductor pattern including an infrared ray sensing element is disposed, to transmit an infrared ray. The band pass filter material may include amorphous silicon germanium. The band pass filter material may be a material capable of blocking a light and having a low resistance. Thus, the band pass filter material is used for the guard ring 201, which may be considered a wiring.

The wiring connecting part 202 is formed in the peripheral area PA to physically and/or electrically connect the guard ring 201 with the gate line 301. A single guard ring 201 may extend around the display area DA, while a plurality of wiring connecting parts 202 respectively extend from the guard ring 201. Taking FIG. 1 and FIG. 2 together, a first group of wiring connecting parts 202 respectively connects to a gate line 301 of a plurality of gate lines 301 at the left side of the display area DA. Taking FIG. 1 and FIG. 3 together, a second group of wiring connecting parts 202 respectively connects to a pad part 303 of a plurality of pad parts 303 at the right side of the display area DA. The wiring connecting part 202 may include a same material as the guard ring 201. The wiring connecting part 202 and the guard ring 201 may be continuous with each other, be disposed in a same layer of the display panel, and form a single, unitary, indivisible member.

The semiconductor layer 200 includes the guard ring 201 and the wiring connecting part 202. The guard ring 201 may have the substantially rectangular shape surrounding the display area DA of the display panel. The pad part 303 may be disposed in the peripheral area PA and connected with the gate line 301 by a connecting electrode (not shown in FIG. 3). The gate line 301 may be disposed in the display area DA and lengthwise extend in the first extension direction which crosses the second extension direction.

The wiring connecting part 202 is disposed in the peripheral area PA to connect the guard ring 201 with the pad part 303. The gate line 301 and the pad part 303 are electrically connected to each other by the guard ring 201 extending around the display area DA and the plurality of wiring connecting parts 202 extended from the guard ring 201, so that the gate line 301 and the pad part 303 may be at equipotential. Thus, an electrostatic charge between the gate line 301 and the pad part 303 may be reduced or effectively prevented. In an exemplary embodiment of manufacturing the touch display apparatus, referring to FIG. 1, the guard ring 201 and/or the wiring connecting part 202 at the left side of the display area DA and the common voltage wiring 302, at the left side of the display area DA and between the common voltage wiring 302 and the gate line 301, and at the right side of the display area DA and the pad part 303 are etched in a process of etching a second insulation layer 404. Thus, in the exemplary embodiment of the touch display apparatus, the guard ring 201 and the wiring connecting part 202 at the left side of the display area DA and the common voltage wiring 302, at the left side of the display area DA and between the common voltage wiring 302 and the gate line 301, and at the right side of the display area DA and the pad part 303 do not remain in a finished touch display apparatus according to the invention.

In an exemplary embodiment of manufacturing the touch display apparatus, a gate metal pattern is formed on the wiring connecting part 202, on a base substrate 100. The gate line 301 of the gate metal pattern is overlapped with the wiring connecting part 202, so that the gate line 301 is electrically connected with the guard ring 201 through the wiring connecting part 202 in one area of the display panel, e.g., at the left side of the display area DA. The guard ring 201 is also electrically connected with the pad part 303 in another area of the display panel, e.g., at the right side of the display area DA, so that the gate line 301 and the pad part 303 may be at equipotential.

Figure 4:
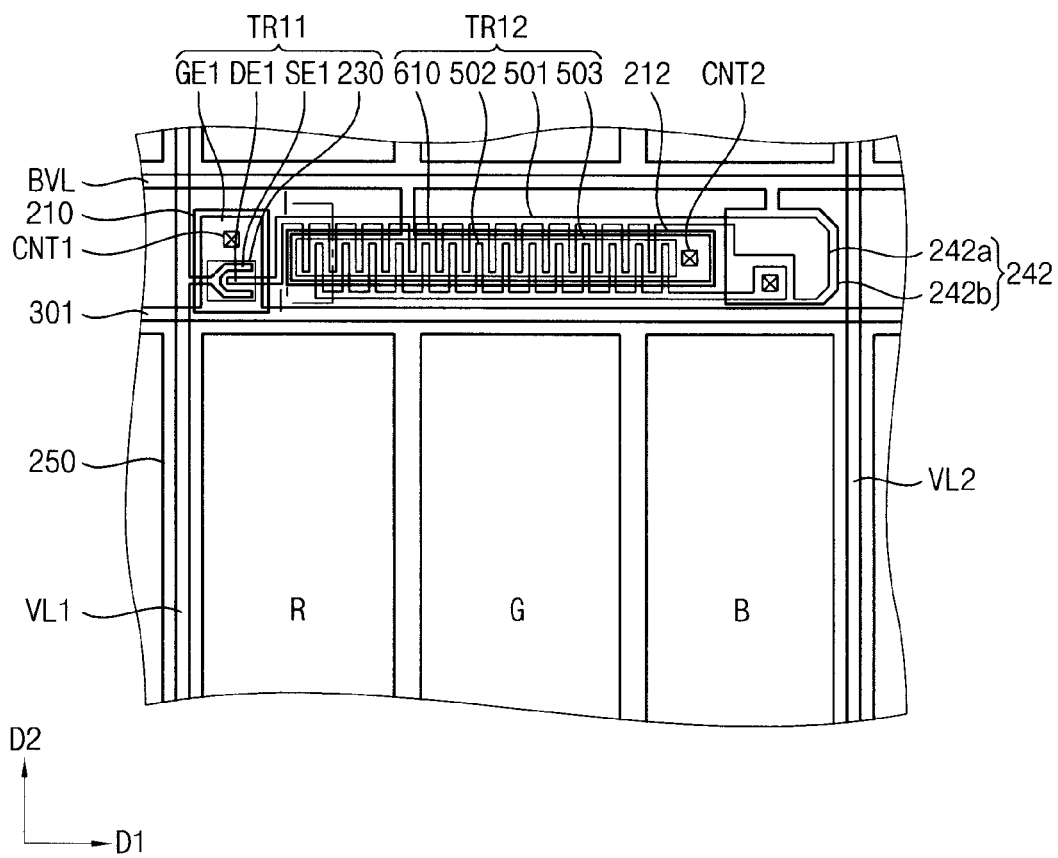
FIG. 4 is a plan view illustrating a portion of an exemplary embodiment of a unit pixel of the touch display apparatus according to the invention.

FIG. 4 is a plan view illustrating a portion of an exemplary embodiment of a unit pixel of the touch display apparatus according to the invention.

Figure 9:
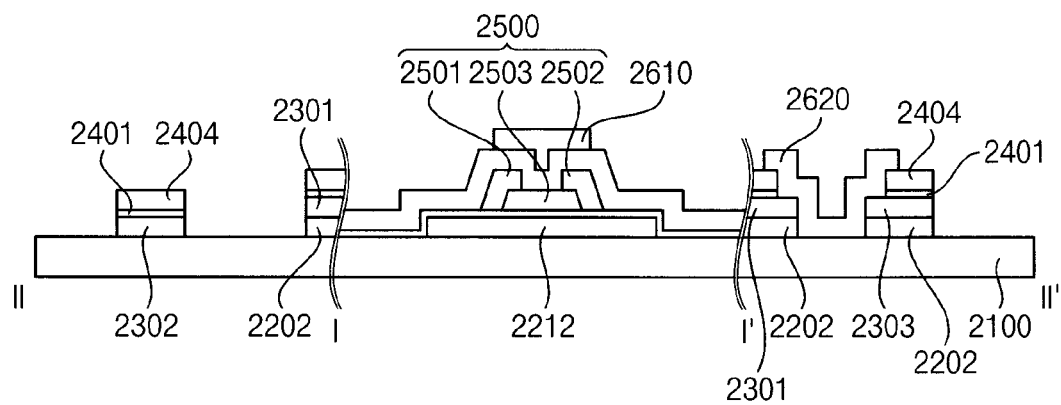
FIG. 9 is a cross-sectional view still another exemplary embodiment of the touch display apparatus, taken along line II-II' in FIG. 1 and taken along line I-I' in FIG. 4, according to the invention.

Referring to FIG. 4, the touch display apparatus includes one or more of a signal line, a first voltage line VL1, a second voltage line VL2, a first light blocking semiconductor pattern 210, a second light blocking semiconductor pattern 212, a switching element TR11, a sensing element TR12 and a capacitor 242. The signal line may include the gate line 301 and/or a bias voltage line BVL. While the sensing element of the unit pixel is generally indicated in FIG. 4 as TR12, exemplary embodiments of cross-sectional structures of the unit pixel sensing element are further described with sensing elements 500 (FIG. 5), 1500 (FIG. 7) and 2500 (FIG. 9).

The gate line 301 lengthwise extends in a first direction D1 and applies a gate signal to the touch display apparatus. The bias voltage line BVL lengthwise extends in the first direction D1 and applies a bias voltage to the touch display apparatus.

The first voltage line VL1 lengthwise extends in a second direction D2 crossing the first direction D1 and applies a first voltage to the touch display apparatus. The second voltage line VL2 lengthwise extends in the second direction D2 and applies a second voltage to the touch display apparatus. The second voltage line VL2 is disposed opposite to the first voltage line VL1 with respect to a center area of the unit pixel, for example, the first voltage line VL1 is on the left side of the unit pixel while the second voltage line VL2 is on the right side of the unit pixel.

The first light blocking semiconductor pattern 210 may include a semiconductor material. The semiconductor material may include amorphous silicon germanium (a-SiGe). The first light blocking semiconductor pattern 210 may be disposed in a region corresponding to the switching element TR11. The first light blocking semiconductor pattern 210 is configured to block a visible light and transmit an infrared light.

The second light blocking semiconductor pattern 212 may include a semiconductor material. The semiconductor material may include amorphous silicon germanium (a-SiGe). The second light blocking semiconductor pattern 212 may be disposed in a region corresponding to the sensing element TR12. The second light blocking semiconductor pattern 212 is configured to block a visible light and transmit an infrared light.

The switching element TR11 may include a first semiconductor pattern 230, a first source electrode SE1, a first drain electrode DE1 and a first gate electrode GE1. The switching element TR11 may participate in driving the sensing element TR12.

The first semiconductor pattern 230 is disposed on the first insulation layer 401 which overlaps the first light blocking semiconductor pattern 210, on the base substrate 100. The first semiconductor pattern 230 may have a double layer structure including an active layer and an ohmic contact layer. The active layer may include amorphous silicon (a-Si). The ohmic contact layer may include amorphous silicon doped with n-type impurities of a high concentration (n+ a-Si).

The first source and drain electrodes SE1 and DE1 are spaced apart from each other with respect to the first gate electrode GE1, and are disposed on the first semiconductor pattern 230. The first source electrode SE1 is physically and/or electrically connected to the first voltage line VL1 and receives the first voltage.

The first gate electrode GE1 is disposed on a second insulation layer 404 which is disposed on the first insulation layer 401. The first gate electrode GE1 is electrically connected to the first light blocking semiconductor pattern 210 through a first contact hole CNT1. The first contact hole CNT1 may be defined in the first and/or second insulation layers 401 and 404. The first light blocking semiconductor pattern 210 receives the gate signal through the first gate electrode GE1.

The first switching element TR11 may have a double gate structure including the first light blocking semiconductor pattern 210 and the first gate electrode GE1. The switching element TR11 transmits the first voltage to the sensing element TR12 in response to the gate signal. The first voltage is applied to the first voltage line VL1.

The sensing element TR12 may detect a position of an object making contact with the base substrate 100, by using an infrared light. In one exemplary embodiment, for example, an infrared light from a backlight assembly (not shown) of the touch display apparatus is reflected from the object making contact with the base substrate 100, and the reflected infrared light is incident to the sensing element TR12. The sensing element TR12 may detect the position of the object using the incident infrared light. The backlight assembly may include a first light source generating an infrared light, and a second light source generating a visible light.

The sensing element TR12 includes a second semiconductor pattern 503, a second source electrode 501, a second drain electrode 502 and a second gate electrode 610.

The second semiconductor pattern 503 is formed on the first insulation layer 401 which overlaps the second light blocking semiconductor pattern 212, on the base substrate 100. The second semiconductor pattern 503 may include a double layer structure including an active layer and an ohmic contact layer. The active layer may include amorphous silicon (a-Si). The ohmic contact layer may include amorphous silicon doped with n-type impurities of a high concentration (n+ a-Si).

The second source electrode 501 is disposed on the second semiconductor pattern 503 and is connected to the first drain electrode DE1 of the switching element TR11. In the plan view, the second source electrode 501 may have an embossing or comb-like structure having a repeated U-shape. A channel region of the sensing element TR12 may be increased by the second source electrode 501 having the repeated U-shape, so that electric charge mobility may be increased in the channel region. Therefore, electric characteristics of the sensing element TR12 may be enhanced.

In the plan view, the second drain electrode 502 is spaced apart from second source electrode 501 on the second semiconductor pattern 503, and may have the embossing or comb-like structure having the repeated U-shape corresponding to the second source electrode 501. Portions of the second source and drain electrodes 501 and 502 may alternate with each other in the first direction D1.

The second source and drain electrodes 501 and 502 are covered by the second insulation layer 404. A second contact hole CNT2 is defined in the second insulation layer 404 and exposes the second light blocking semiconductor pattern 212.

The second gate electrode 610 is disposed on the second insulation layer 404. The second gate electrode 610 is electrically connected to the second light blocking semiconductor pattern 212 through the second contact hole CNT2. The second light blocking semiconductor pattern 212 receives the gate signal through the second gate electrode 610.

The sensing element TR12 may have a double gate structure including the second light blocking semiconductor pattern 212 and the second gate electrode 610.

The capacitor 242 includes a first electrode 242a and a second electrode 242b. The first electrode 242a is electrically connected to the second source electrode 501 of the sensing element TR12, such as being continuous with the second source electrode 501. The second electrode 242b overlaps the first electrode 242a and is electrically connected to the bias voltage line BVL, such as being continuous with the bias voltage line BVL. The capacitor 242 is electrically charged by a voltage difference between the first and second electrodes 242a and 242b.

A black matrix pattern 250 is disposed on the first gate electrode GE1, the second gate electrode 610 and the second electrode 242b, on the base substrate 100. A color filter layer is disposed on the base substrate 100 including the black matrix pattern thereon. An over-coating layer is disposed on the base substrate 100 including the color filter layer thereon. A common electrode (not shown) is disposed on the over-coating layer, on the base substrate 100. The color filter layer is disposed in pixel areas R, G and B. The color filter layer may include a red color filter, a green color filter and a blue color filter. The red, green and blue color filters may be respectively in the R, G and B pixel areas.

Figure 5:
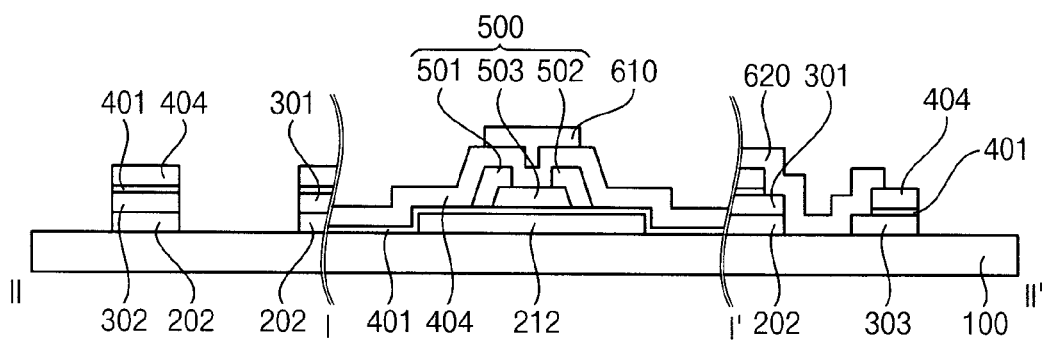
FIG. 5 is a cross-sectional view taken along line II-II' in FIG. 1 and taken along line I-I' in FIG. 4.

FIG. 5 is a cross-sectional view taken along line II-II' in FIG. 1 and taken along a line I-I' in FIG. 4, after portions of the guard ring and wire connecting part have been removed.

Referring to FIG. 5, the semiconductor layer 200, the gate line 301, the first insulation layer 401, a sensing element 500, the second insulation layer 404, the second gate electrode 610 and a connecting electrode 620 are disposed on the base substrate 100. The semiconductor layer 200 includes the guard ring 201, the wiring connecting part 202 and the second light blocking semiconductor pattern 212. The guard ring 201, the wiring connecting part 202 and the second light blocking semiconductor pattern 212 may be in a same layer of the display panel. The wiring connecting part 202 is disposed on the base substrate 100. The wiring connecting part 202 is overlapped with the gate line 301. The second light blocking semiconductor pattern 212 is overlapped with the sensing element 500.

The gate line 301 is disposed on the base substrate 100 including the wiring connecting part 202 thereon. The gate line 301 lengthwise in the first direction D1 and transmits a gate signal. In an exemplary embodiment of manufacturing the touch display apparatus, after the gate line 301 is formed, the first insulation layer 401 and the sensing element 500 are formed sequentially. The sensing element 500 may include the second source electrode 501, the second drain electrode 502 and the second semiconductor pattern 503. The sensing element 500 may include the second gate electrode 610. Although one sensing element 500 is illustrated in the drawings, a plurality of sensing elements may be formed and may be collectively indicated as 500. After the sensing element 500 is formed, the second insulation layer 404 is formed. The second insulation layer 404 insulates the sensing element 500 and the second gate electrode 610 from each other. The gate electrode 610 and the connecting electrode 620 are formed on the second insulation layer 404, such as in a same layer of the display panel. The connecting electrode 620 connects the gate line 301 and the pad part 303 to each other. The gate electrode 610 and the connecting electrode 620 are formed on and in a same layer. In the illustrated exemplary embodiment, the wiring connecting part 202 is overlapped with the gate line 301, but is not limited thereto. The wiring connecting part 202 may be overlapped with various signal lines, such as the gate line 301 and the bias voltage line BVL.

Hereinafter, an exemplary embodiment of a method of manufacturing of a touch display apparatus according to the invention will be explained in detail with reference to drawings.

FIGS. 6A to 6E are cross-sectional views illustrating an exemplary embodiment of a method of manufacturing the touch display apparatus in FIG. 5.

Figure 6A:
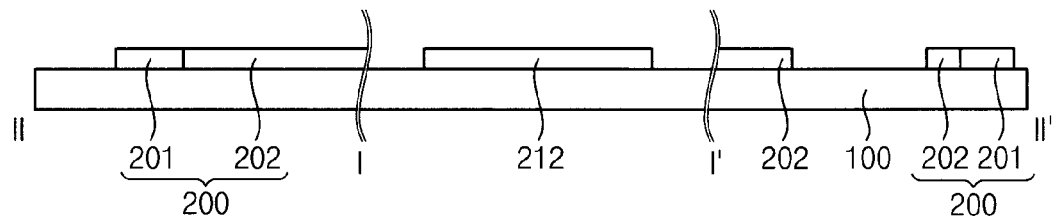
FIGS. 6A to 6E are cross-sectional views illustrating an exemplary embodiment of a method of manufacturing the touch display apparatus of FIG. 5, taken along line II-II' in FIG. 1 and taken along line I-I' in FIG. 4, according to the invention.

Referring to FIG. 6A, a semiconductor layer 200 is formed (e.g., provided) on the base substrate 100. The semiconductor layer 200 includes the guard ring 201, the wiring connecting part 202 and the second light blocking semiconductor pattern 212. The guard ring 201 is formed in a substantially rectangular shape surrounding the display area DA. The guard ring 201, the wiring connecting part 202 and the second light blocking semiconductor pattern 212 are in a same layer of the touch display apparatus.

The wiring connecting part 202 is formed in a region where the gate line 301 is formed. The wiring connecting part 202 is formed to connect a left portion of the guard ring 201 at a left side of the display area DA and the common voltage wiring 302 to be formed, the common voltage wiring 302 and the gate line 301 to be formed, and a right portion of the guard ring 201 at a right side of the display area DA and the pad part 303 to be formed.

The second light blocking semiconductor pattern 212 is formed in a region where the sensing element 500 is formed. The second light blocking semiconductor pattern 212 is formed using a band pass filter material, to block a visible light and to transmit an infrared light.

Figure 6B:
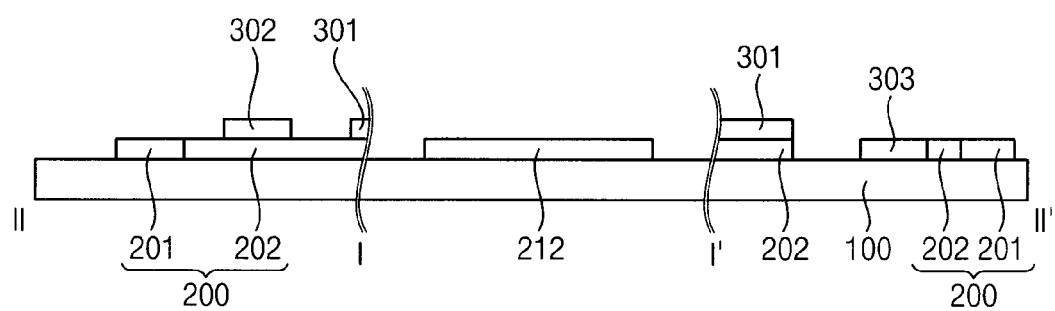

Referring to FIG. 6B, a gate metal pattern is formed on the base substrate 100 including the guard ring 201, the wiring connecting part 202 and the second light blocking semiconductor pattern 212 thereon. The gate metal pattern includes the gate line 301, the common voltage wiring 302 and the pad part 303.

A portion of the gate line 301 in the display area DA and the common voltage wiring 302 in the peripheral area are disposed overlapping with the wiring connecting part 202. The pad part 303 is not overlapped with the wiring connecting part 202. The pad part 303 is disposed to contact the wiring connecting part 202 connected with the right portion of the guard ring 201. Thus, the gate line 301 is electrically connected with the common voltage wiring 302 at the left portion of the guard ring 201, and the pad part 303 is electrically connected with the right portion of the guard ring 201. In addition, the common voltage wiring 302 is electrically connected with the left portion of the guard ring 201, so that the gate line 301, the common voltage wiring 302 and the pad part 303 are electrically connected with each other.

The guard ring 201 and the wiring connecting part 202 are formed using a band pass filter material. The band pass filter material may have a low electrical resistance, so that the gate line 301, the common voltage wiring 302 and the pad part 303 are electrically connected with each other and may be equipotential. The gate line 301 and the pad part 303 are equipotential, so that the electrostatic charge between the gate line 301 and the pad part 303 may be not generated.

Figure 6C:
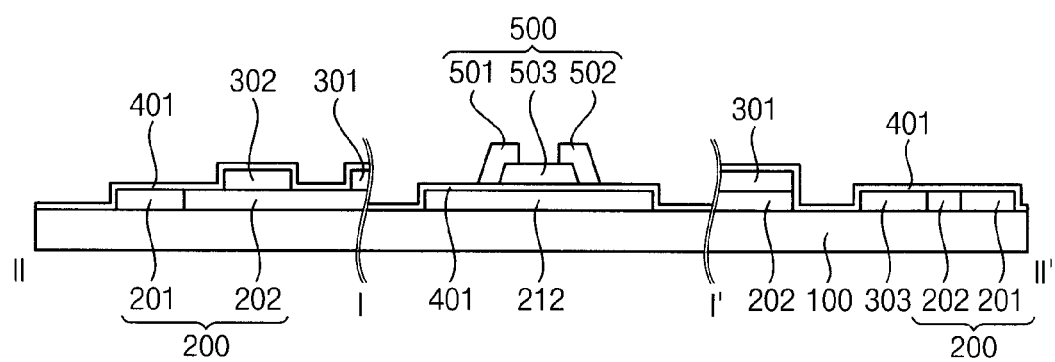

Referring to FIG. 6C, the first insulation layer 401 and the sensing element 500 are formed sequentially on the base substrate 100 including the gate metal pattern 300 thereon. After the first insulation layer 401 is formed, the sensing element 500 is formed in a region the second light blocking semiconductor pattern 212 is formed. Since a process of forming the sensing element 500 uses a dry etching process, an electrostatic charge may be generated. In a conventional touch display apparatus, due to a potential difference between the gate line 301 and the pad part 303 during a manufacturing process, the electrostatic charge may be generated between the gate line 301 and the pad part 303.

However, in the exemplary embodiment of the touch display apparatus, the gate line 301 and the pad part 303 of the touch display apparatus according to the invention may be at equipotential by the guard ring 201 and the wiring connecting part 202, so that generation of the electrostatic charge may be reduced or effectively prevented.

Figure 6D:
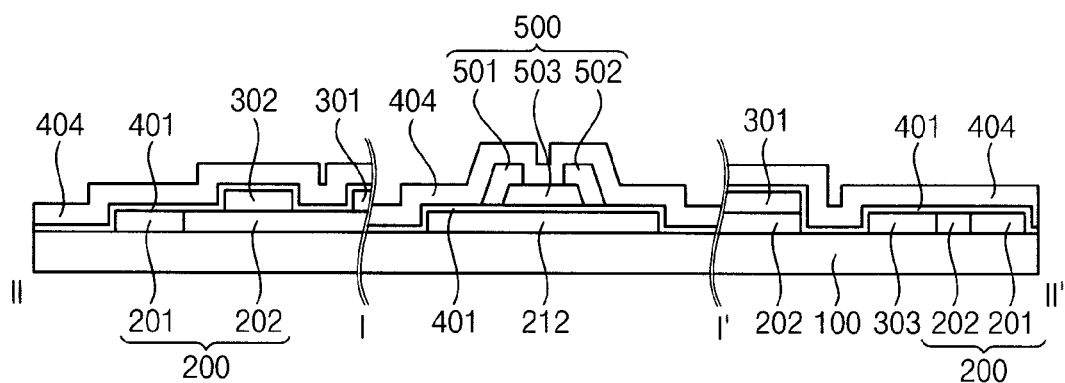

Referring to FIG. 6D, the second insulation layer 404 is formed on the base substrate 100 including the sensing element 500 thereon. The second insulation layer 404 insulates the sensing element 500 and the second gate electrode 610 from each other. In the FIG. 6D, the second insulation layer 404 is not etched. In a subsequent process of etching the second insulation layer 404, portions of the guard ring 201 and the wiring connecting part 202 at a left side of the display area DA and the common voltage wiring 302, between the common voltage wiring 302 and the gate line 301, and at a right side of the display area DA and the pad part 303 are etched, so as to remove portions thereof.

Figure 6E:
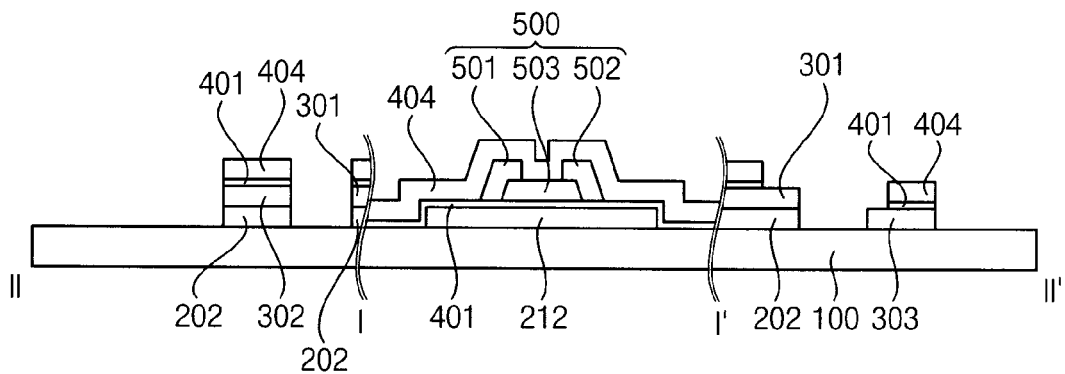

Referring to FIG. 6E, the second insulation layer 404 is etched. In a process of etching the second insulation layer 404, portions of the guard ring 201 and the wiring connecting part 202 at the left side of the display area DA and the common voltage wiring 302, between the common voltage wiring 302 and the gate line 301, and at the right side of the display area DA and the pad part 303 are etched. The first and second insulation layers 401 and 404 in these areas are etched away. Thus, the guard ring 201 is entirely removed and the wiring connecting part 202 is partially removed in the etching of the second insulation layer 404. A portion of the wiring connecting part 202 remains under the gate line 301 and under the common voltage wiring 302. Thus, after etching of the second insulation layer 404, the gate line 301, the common voltage wiring 302, the pad part 303 and a part of the wiring connecting part 202 are disposed on the base substrate 100. At this time, a part of the gate line 301 and a part of the pad part 303 are exposed, so that the gate line 301 and the pad part 303 can be electrically connected by the connecting electrode 620 to be formed.

Referring again to FIG. 5, in a process of etching the second insulation layer 404, the guard ring 201 and the part of the wiring connecting part 202 are removed. The second gate electrode 610 and the connecting electrode 620 are formed on the base substrate 100. The second gate electrode 610 and the connecting electrode 620 are formed on and in a same layer of the display panel. The connecting electrode 620 connects the partially exposed gate line 301 and the partially exposed pad part 303 to each other. In a conventional touch display apparatus, when the gate line 301 and the pad part 303 are not connected to each other, the electrostatic charge may be generated by a potential difference between the gate line 301 and the pad part 303. However, in the exemplary embodiment, the guard ring 201 and the wiring connecting part 202 remove the potential difference between the gate line 301 and the pad part 303, so that generation of the electrostatic charge may be reduced or effectively prevented. In the illustrated exemplary embodiment, the wiring connecting part 202 is overlapped with the gate line 301, but is not limited thereto. The wiring connecting part 202 may be overlapped with various signal lines including the gate line 301 and the bias voltage line BVL.

In the illustrated exemplary embodiment, the guard ring 201 and the wiring connecting part 202 including band pass filter material electrically connect the gate line 301 and the pad part 303 to each other, so that the potential difference between the gate line 301 and the pad part 303 is removed. Thus, generation of the electrostatic charge may be reduced or effectively prevented. In addition, the guard ring 201 and the wiring connecting part 202 are formed using a band pass filter material, so that the guard ring 201 and the wiring connecting part 202 may be removed easily during manufacturing of the touch display apparatus and damage to the gate line 301 may be reduced or effectively prevented.

Figure 7:
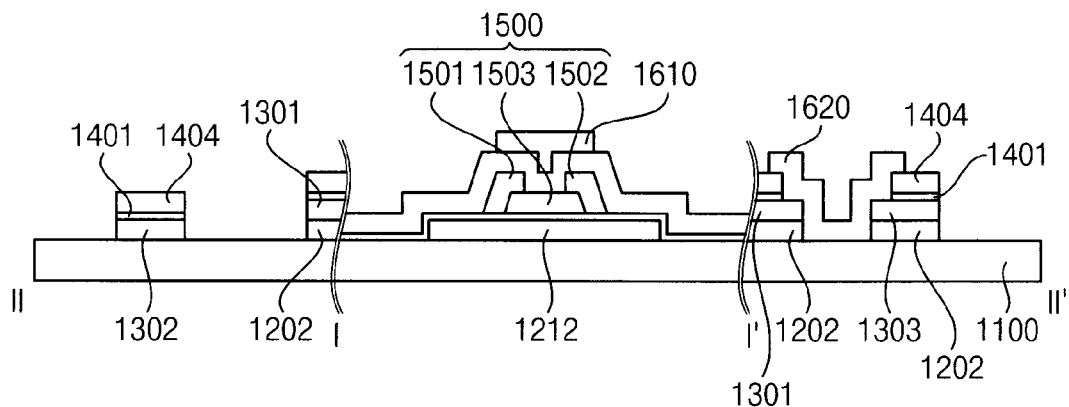
FIG. 7 is a cross-sectional view of another exemplary embodiment of the touch display apparatus, taken along line II-II' in FIG. 1 and taken along line I-I' in FIG. 4 according to the invention.

FIG. 7 is a cross-sectional view illustrating another exemplary embodiment of a touch display apparatus according to the invention, after respective portions of the wire connecting part have been removed. FIGS. 8A to 8E are cross-sectional views illustrating an exemplary embodiment of a method of manufacturing the touch display apparatus in FIG. 7.

Referring to FIG. 7, a wiring connecting part 1202, a gate metal pattern, a first insulation layer 1401, a sensing element 1500, a second insulation layer 1404, a second gate electrode 1610 and a connecting electrode 1620 are disposed on the base substrate 1100. The gate metal pattern includes a gate line 1301, a common voltage wiring 1302 and a pad part 1303.

The wiring connecting part 1202 is disposed on a base substrate 1100. The wiring connecting part 1202 removes a potential difference between the gate line 1301 and the pad part 1303. The wiring connecting part 1202 includes a band pass filter material.

The wiring connecting part 1202 is initially disposed under the gate line 1301, under the pad part 1303, and between the gate line 1301 and the pad part 1303. The wiring connecting part 1202 continuously extends from under the gate line 1301 to under the pad part 1303. However, in an exemplary embodiment of manufacturing the touch display apparatus, in a process of etching the second insulation layer 1404, the wiring connecting part 1202 disposed between the gate line 1301 and the pad part 1303 is etched away. Thus, the wiring connecting part 1202 of a finished touch display apparatus remains only under the gate line 1301 and under the pad part 1303.

In an exemplary embodiment of manufacturing the touch display apparatus, the gate metal pattern is formed on the base substrate 1100 including the wiring connecting part 1202 thereon. The gate metal pattern includes the gate line 1301, the common voltage wiring 1302 and the pad part 1303. A plurality of gate lines 1301 may be formed. The gate line 1301 lengthwise extends in a first direction D1. Referring to FIG. 1, the pad part 1303 is disposed at a right end the gate line 1301. The gate line 1301 and the pad part 1303 are spaced apart from each other in the first direction D1. Due to a potential difference between the gate line 1301 and the pad part 1303, an electrostatic charge may be generated between the gate line 1301 and the pad part 1303. Thus, the wiring connecting part 1202 is used for removing the potential difference between the gate line 1301 and the pad part 1303.

The first insulation layer 1401 is formed on the base substrate 1100 including the gate metal pattern thereon. The sensing element 1500 is formed on the base substrate 1100 including the first insulation layer 1401 thereon. The sensing element 1500 includes a second source electrode 1501, a second drain electrode 1502 and a second semiconductor pattern 1503.

The second insulation layer 1404 is formed on the base substrate 1100 including the sensing element 1500 thereon. The second gate electrode 1610 and the connecting electrode 1620 are formed on the base substrate 1100 including the second insulation layer 1404 thereon. The second gate electrode 1610 and the connecting electrode 1620 are formed on and in a same layer of the display panel. The connecting electrode 1620 connects the gate line 1301 and the pad part 1303 to each other.

Figure 8A:
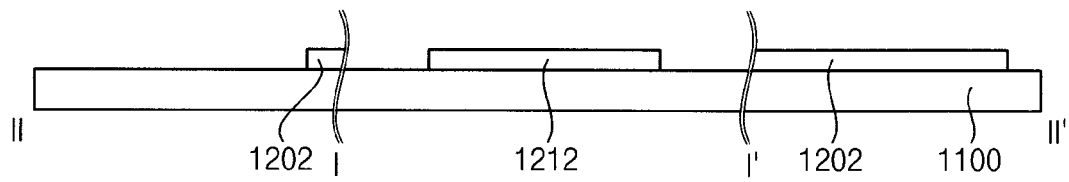
FIGS. 8A to 8E are cross-sectional views illustrating an exemplary embodiment of a method of manufacturing the touch display apparatus of FIG. 7, taken along line II-II' in FIG. 1 and taken along line I-I' in FIG. 4, according to the invention.

Referring to FIG. 8A, a semiconductor layer is formed (e.g., provided) on the base substrate 1100. The semiconductor layer includes the wiring connecting part 1202 and a second light blocking semiconductor pattern 1212. The wiring connecting part 1202 is formed in a region in which the gate line 1301 is formed. The wiring connecting part 1202 is formed to connect the gate line 1301 and the pad part 1303 to each other. Unlike the method in FIG. 7A, the semiconductor layer omits the guard ring.

The second light blocking semiconductor pattern 1212 is formed in a region in which the sensing element 1500 is formed. The second light blocking semiconductor pattern 1212 is formed using a band pass filter material, to block a visible light and to transmit an infrared light.

Figure 8B:
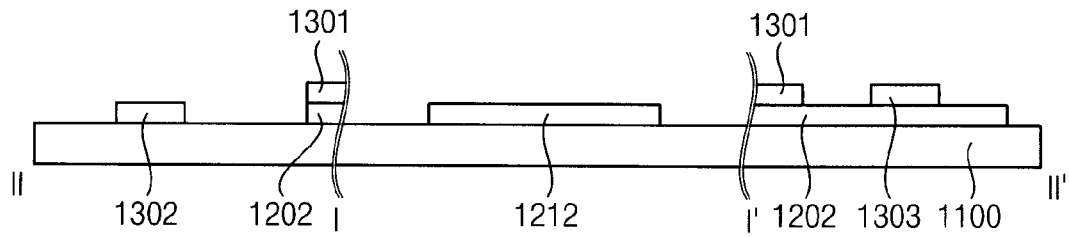

Referring to FIG. 8B, the gate metal pattern is formed on the base substrate 1100 including the wiring connecting part 1202 thereon. The gate metal pattern includes the gate line 1301, the common voltage wiring 1302 and the pad part 1303. The wiring connecting part 1202 continuously extends from under the gate line 1301 to under the pad part 1303.

The gate line 1301 and the pad part 1303 are disposed overlapping with the wiring connecting part 1202. The common voltage wiring 1302 is not overlapped with the wiring connecting part 1202. The wiring connecting part 1202 is formed using a band pass filter material. The band pass filter material may have a low electrical resistance, so that the gate line 1301 and the pad part 1303 are electrically connected with each other and may be at equipotential. The gate line 1301 and the pad part 1303 are at equipotential, so that generation of the electrostatic charge between the gate line 1301 and the pad part 1303 may be reduced or effectively prevented.

Figure 8C:
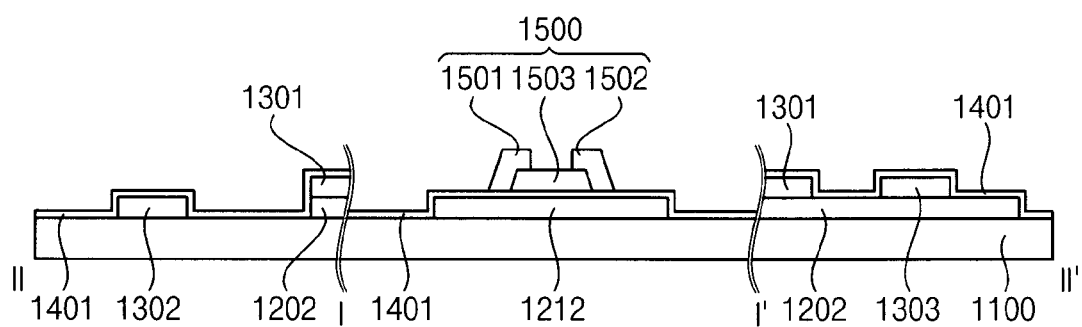

Referring to FIG. 8C, the first insulation layer 1401 and the sensing element 1500 are formed sequentially on the base substrate 1100 including the gate metal pattern thereon. After the first insulation layer 1401 is formed, the sensing element 1500 is formed in a region where the second light blocking semiconductor pattern 1212 is formed. Since a process of forming the sensing element 1500 uses a dry etching process, an electrostatic charge may be generated. In a conventional touch display apparatus, due to a potential difference between the gate line 1301 and the pad part 1303, an electrostatic charge may be generated between the gate line 1301 and the pad part 1303. However, in the exemplary embodiment of the touch display apparatus, the gate line 1301 and the pad part 1303 of the touch display apparatus according to the invention may be at equipotential by the wiring connecting part 1202, so that generation of the electrostatic charge may be reduced or effectively prevented.

Figure 8D:
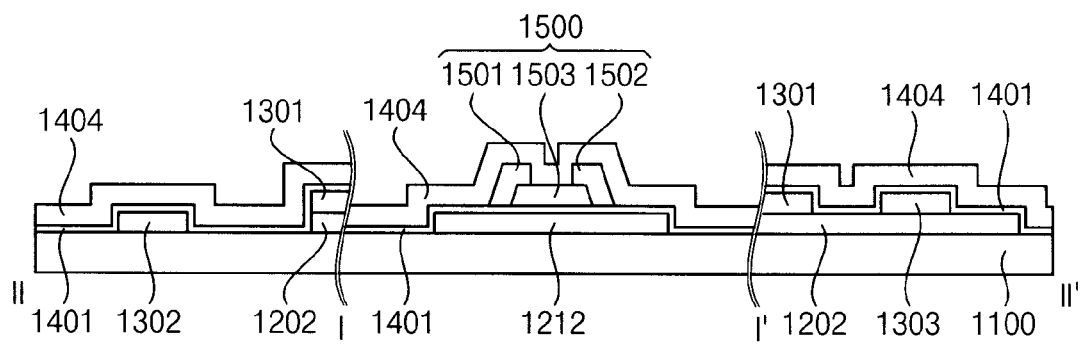

Referring to FIG. 8D, the second insulation layer 1404 is formed on the base substrate 1100 including the sensing element 1500 thereon. The second insulation layer 1404 insulates the sensing element 1500 and the second gate electrode 1610 from each other. In the FIG. 8D, the second insulation layer 1404 is not etched. In a subsequent process of etching the second insulation layer 1404, portions of the wiring connecting part 1202 connecting the gate line 1301 the pad part 1303 to each other are etched.

Figure 8E:
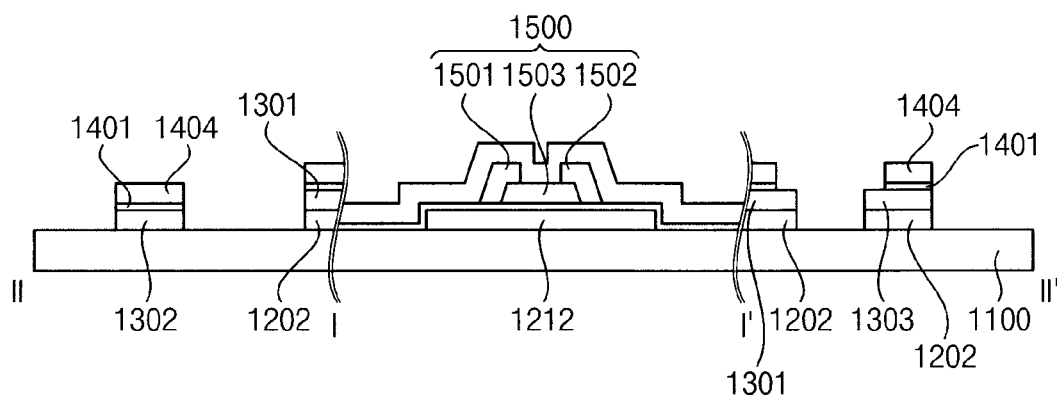

Referring to FIG. 8E, the second insulation layer 1404 is etched. In a process of etching the second insulation layer 1404, portions of the wiring connecting part 1202 connecting the gate line 1301 and the pad part 1303 to each other are etched away. Thus, the wiring connecting part 1202 is partially removed. A portion of the wiring connecting part 1202 remains under the gate line 1301 and under the pad part 1303. Thus, after etching of the second insulation layer 1404, the gate line 1301, the common voltage wiring 1302, the pad part 1303 and a part of the wiring connecting part 1202 are disposed on the base substrate 1100. At this time, a part of the gate line 1301 and a part of the pad part 1303 are exposed, so that the gate line 1301 and the pad part 1303 can be electrically connected by the connecting electrode 1620 to be formed.

Referring again to FIG. 7, in a process of etching the second insulation layer 1404, the part of the wiring connecting part 1202 is removed. The second gate electrode 1610 and the connecting electrode 1620 are formed on the base substrate 1100. The second gate electrode 1610 and the connecting electrode 1620 are formed on and in a same layer of the display panel. The connecting electrode 1620 connects the partially exposed gate line 1301 and the partially exposed pad part 1303 to each other. In a conventional touch display apparatus, when the gate line 1301 and the pad part 1303 are not connected to each other, the electrostatic charge may be generated by a potential difference between the gate line 1301 and the pad part 1303. However, in the exemplary embodiment, the wiring connecting part 1202 removes the potential difference between the gate line 1301 and the pad part 1303, so that generation of the electrostatic charge may be reduced or effectively prevented. In the illustrated exemplary embodiment, the wiring connecting part 1202 is overlapped with the gate line 1301, but is not limited thereto. The wiring connecting part 1202 may be overlapped with various signal lines including the gate line 1301 and the bias voltage line BVL.

In the illustrated exemplary embodiment, the wiring connecting part 1202 including band pass filter material electrically connects the gate line 1301 and the pad part 1303 to each other, so that the potential difference between the gate line 1301 and the pad part 1303 is removed. Thus, generation of the electrostatic charge may be reduced or effectively prevented. In addition, the wiring connecting part 1202 is formed using a band pass filter material, so that the wiring connecting part 1202 may be removed easily during manufacturing of the touch display apparatus and damage to the gate line may be reduced or effectively prevented.

FIG. 9 is a cross-sectional view illustrating still another exemplary embodiment of a touch display apparatus according to the invention after a portion of the wire connecting part has been removed. FIGS. 10A to 10E are cross-sectional views illustrating an exemplary embodiment of a method of manufacturing the touch display apparatus according to FIG. 9.

Referring to FIG. 9, a wiring connecting part 2202, a gate metal pattern, a first insulation layer 2401, a sensing element 2500, a second insulation layer 2404, a second gate electrode 2610 and a connecting electrode 2620 are disposed on a base substrate 2100. The gate metal pattern includes a gate line 2301, a common voltage wiring 2302 and a pad part 2303.

The wiring connecting part 2202 is disposed on the base substrate 2100. The wiring connecting part 2202 removes a potential difference between the gate line 2301 and the pad part 2303. The wiring connecting part 2202 is formed using a band pass filter material.

First and second separated portions of the wiring connecting part 2202 are initially disposed under the gate line 2301 and under the pad part 2303, respectively. A third portion of the wiring connecting part 2202 is disposed between the gate line 2301 and the pad part 2303, and spaced apart from the gate line 2301 and the pad part 2303. However, in an exemplary embodiment of manufacturing the touch display apparatus, in a process of etching the second insulation layer 2404, the third portion of the wiring connecting part 2202 disposed between the gate line 1301 and the pad part 2303 is etched. Thus, the wiring connecting part 2202 of a finished touch display apparatus remains only under the gate line 2301 and under the pad part 2303.

In an exemplary embodiment of manufacturing the touch display apparatus, the gate metal pattern is formed on the base substrate 2100 including the wiring connecting part 2202 thereon. The gate metal pattern includes the gate line 2301, the common voltage wiring 2302 and the pad part 2303. A plurality of gate lines 2301 may be formed. The gate line 2301 lengthwise extends in a first direction D1. Referring to FIG. 1, the pad part 2303 is disposed at a right end of the gate line 2301. The gate line 2301 and the pad part 2303 are spaced apart from each other in the first direction D1. Due to a potential difference between the gate line 2301 and the pad part 2303, an electrostatic charge may be generated between the gate line 2301 and the pad part 2303. Thus, the wiring connecting part 2202 is used for decreasing the potential difference between the gate line 2301 and the pad part 2303.

The first insulation layer 2401 is formed on the base substrate 2100 on including the gate metal pattern 2300 thereon. The sensing element 2500 is formed on the base substrate 2100 including the first insulation layer 2401 thereon. The sensing element 2500 includes a second source electrode 2501, a second drain electrode 2502 and a second semiconductor pattern 2503.

The second insulation layer 2404 is formed on the base substrate 2100 including the sensing element 2500 thereon. The second gate electrode 2610 and the connecting electrode 2620 are formed on the base substrate 2100 including the second insulation layer 2404. The second gate electrode 2610 and the connecting electrode 2620 are formed on and in a same layer of the display panel. The connecting electrode 2620 connects the gate line 2301 and the pad part 2303 to each other.

Figure 10A:
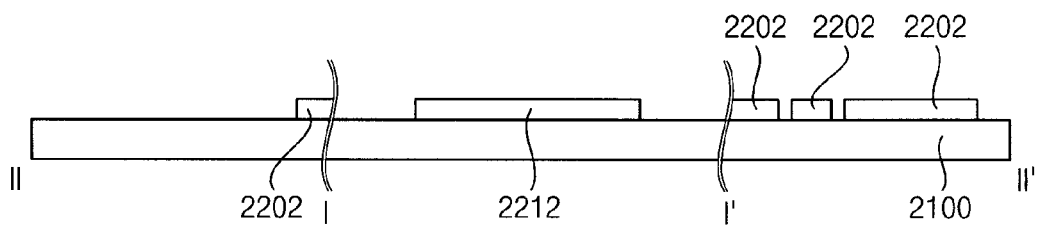
FIGS. 10A to 10E are cross-sectional views illustrating an exemplary embodiment of a method of manufacturing the touch display apparatus of FIG. 9, taken along line II-II' in FIG. 1 and taken along line I-I' in FIG. 4, according to the invention.

Referring to FIG. 10A, a semiconductor layer is formed (e.g., provided) on the base substrate 2100. The semiconductor layer includes the wiring connecting part 2202 and a second light blocking semiconductor pattern 2212. The wiring connecting part 2202 is formed in a region in which the gate line 2301 and the pad part 2303 are formed. The wiring connecting part 2202 is further formed between the gate line 2301 and the pad part 2303, and spaced apart from the gate line 2301 and the pad part 2303.

The second light blocking semiconductor pattern 2212 is formed in a region in which the sensing element 2500 is formed. The second light blocking semiconductor pattern 2212 is formed using a band pass filter material, to block a visible light and to transmit an infrared light.

Figure 10B:
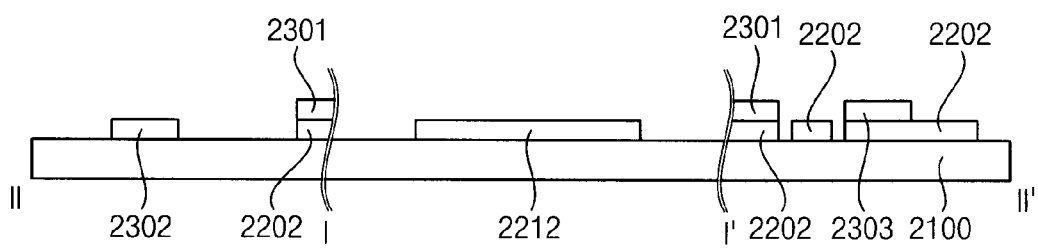

Referring to FIG. 10B, the gate metal pattern is formed on the base substrate 2100 including the wiring connecting part 2202 thereon. The gate metal pattern includes the gate line 2301, the common voltage wiring 2302 and the pad part 2303.

The gate line 2301 and the pad part 2303 are disposed overlapping with the wiring connecting part 2202. The common voltage wiring 2302 is not overlapped with the wiring connecting part 2202. The wiring connecting part 2202 is formed using a band pass filter material. The band pass filter material may have a low electrical resistance, so that the wiring connecting part 2202 spaced apart from the gate line 2301 and the pad part 2303 may perform a function of a buffer. Thus, generation of the electrostatic charge between the gate line 2301 and the pad part 2303 may be reduced, or even effectively prevented.

Figure 10C:
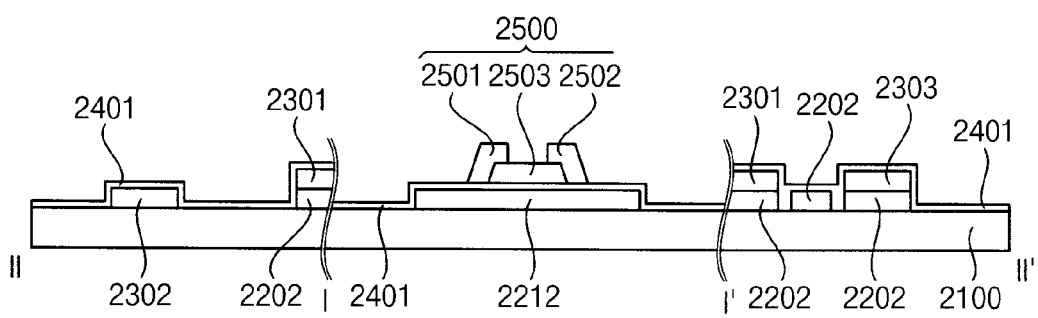

Referring to FIG. 10C, the first insulation layer 2401 and the sensing element 2500 are formed sequentially on the base substrate 2100 including the gate metal pattern thereon. After the first insulation layer 2401 is formed, the sensing element 2500 is formed in a region in which the second light blocking semiconductor pattern 2212 is formed. Since a process of forming the sensing element 2500 uses a dry etching process, an electrostatic charge may be generated. In a conventional touch display apparatus, due to a potential difference between the gate line 2301 and the pad part 2303, an electrostatic charge may be generated between the gate line 2301 and the pad part 2303. However, in the exemplary embodiment of the touch display apparatus, the wiring connecting part 2202 of the touch display apparatus according to the invention performs a function of a buffer, so that the electrostatic charge may be reduced or effectively prevented.

Figure 10D:
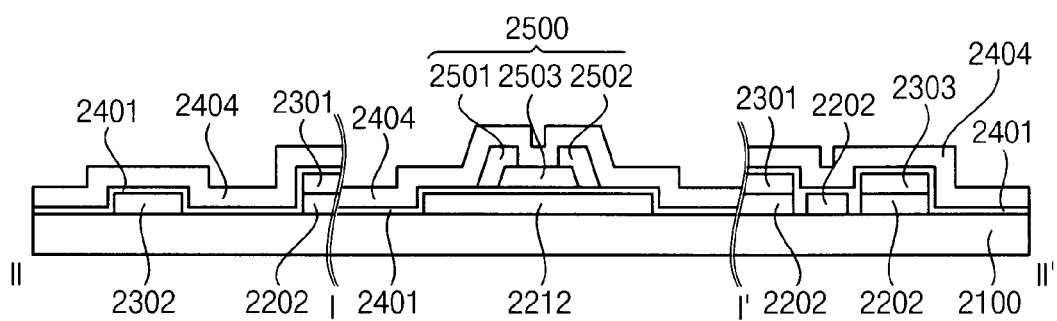

Referring to FIG. 10D, the second insulation layer 2404 is formed on the base substrate 2100 including the sensing element 2500 thereon. The second insulation layer 2404 insulates the sensing element 2500 and the second gate electrode 2610 from each other. In the FIG. 10D, the second insulation layer 2404 is not etched. In a subsequent process of etching the second insulation layer 2404, a portion of the wiring connecting part 2202 spaced apart from the gate line 2301 and the pad part 2303 is etched.

Figure 10E:
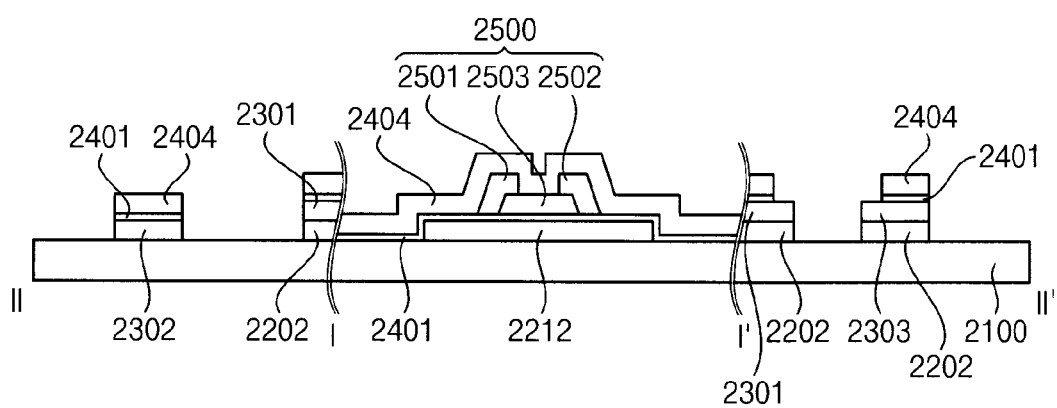

Referring to FIG. 10E, the second insulation layer 2401 is etched. In a process of etching the second insulation layer 2404, the portion of wiring connecting part 2202 spaced apart from the gate line 2301 and the pad part 2303 is etched away. Thus, the wiring connecting part 2202 is partially removed. Another portion of the wiring connecting part 2202 remains under the gate line 2301 and under the pad part 2303. Thus, after etching of the second insulation layer 2404, the gate line 2301, the common voltage wiring 2302, the pad part 2303 and a part of the wiring connecting part 2202 are disposed on the base substrate 2100. At this time, a part of the gate line 2301 and a part of the pad part 2303 are exposed, so that the gate line 2301 and the pad part 2303 can be electrically connected by the connecting electrode 2620 to be formed.

Referring again to FIG. 9, in a process of etching the second insulation layer 2404, the portion of the wiring connecting part 2202 is removed. The second gate electrode 2610 and the connecting electrode 2620 are formed on the base substrate 2100. The second gate electrode 2610 and the connecting electrode 2620 are formed on and in a same layer of the display panel. The connecting electrode 2620 connects the partially exposed gate line 2301 and the partially exposed pad part 2303 to each other. In a conventional touch display apparatus, when the gate line 2301 and the pad part 2303 are not connected to each other, the electrostatic charge may be generated by a potential difference between the gate line 2301 and the pad part 2303. However, in the exemplary embodiment the wiring connecting part 2202 spaced apart from the gate line 2301 and the pad part 2303 may perform a function of a buffer, so that generation of the electrostatic charge may be reduced or effectively prevented. In the illustrated exemplary embodiment, the wiring connecting part 2202 is overlapped with the gate line 2301, but is not limited thereto. The wiring connecting part 2202 may be overlapped with various signal lines including the gate line 2301 and the bias voltage line BVL.

According to the illustrated exemplary embodiment, the wiring connecting part 2202 spaced apart from the gate line 2301 and the pad part 2303 may perform a function of a buffer during a manufacturing process of the touch display apparatus, so that the potential difference between the gate line 2301 and the pad part 2303 is reduced. Thus, generation of the electrostatic charge may be reduced or effectively prevented. In addition, the wiring connecting part 2202 is formed using a band pass filter material, so that the wiring connecting part 2202 may be removed easily during manufacturing of the touch display apparatus and damage to the gate line may be reduced or effectively prevented.

The foregoing is illustrative of the invention and is not to be construed as limiting thereof. Although exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A touch display apparatus comprising:
    a base substrate;
    a light blocking semiconductor pattern on the base substrate, and configured to block a visible light and transmit an infrared light;
    a sensing element on the light blocking semiconductor pattern and configured to detect a touch position using an incident infrared light;
    a driving element configured to drive the sensing element;
    a signal line electrically connected with the sensing element or the driving element; and
    a wiring connecting part under the signal line and comprising a same material as that of the light blocking semiconductor pattern.

2. The touch display apparatus of claim 1, wherein the light blocking semiconductor pattern comprises amorphous silicon germanium.

3. The touch display apparatus of claim 1, wherein the sensing element comprises:
    a semiconductor pattern on the light blocking semiconductor pattern;
    a source electrode overlapping a first end of the semiconductor pattern;
    a drain electrode spaced apart from the source electrode and overlapping a second end of the semiconductor pattern opposing the first end; and
    a gate electrode on the source electrode and the drain electrode.

4. The touch display apparatus of claim 1, wherein the wiring connecting part comprises amorphous silicon germanium.

5. The touch display apparatus of claim 1, wherein the light blocking semiconductor pattern and the wiring connecting part are in a same layer.

6. A method of manufacturing a touch display apparatus, comprising:
    providing a semiconductor layer on a base substrate, the semiconductor layer comprising:
        a light blocking semiconductor pattern configured to block a visible light and transmit an infrared light,
        a wiring connecting part in a display area of the apparatus and comprising a same material as that of the light blocking semiconductor pattern, and
        a guard ring in a peripheral area of the apparatus and connected with the wiring connecting part;
    providing a metal pattern comprising a signal line on the wiring connecting part and lengthwise extending in a direction; and
    providing a sensing element on the metal pattern, and configured to detect a touch position using an incident infrared light.

7. The method of claim 6, wherein the providing the sensing element comprises:
    providing a semiconductor pattern on the light blocking semiconductor pattern;
    providing a source electrode and a drain electrode on the semiconductor pattern;
    providing an insulation layer on the source electrode and the drain electrode; and
    providing a gate electrode on the insulation layer.

8. The method of claim 7, wherein the providing the insulation layer comprises partially removing the guard ring and the wiring connecting part.

9. The method of claim 6, wherein the metal pattern further comprises:
    a common voltage wiring in the peripheral area and lengthwise extending in a direction crossing the signal line; and
    a pad part in the peripheral area, and spaced apart from the signal line.

10. The method of claim 6, wherein the semiconductor layer comprises amorphous silicon germanium.

11. The method of claim 9, further comprising forming a connecting electrode connecting the signal line and the pad part to each other,
    wherein the connecting electrode is in a same layer as the gate electrode.

12. The method of claim 9, wherein the wiring connecting part connects the guard ring with the signal line and connects the guard ring with the pad part.

* * * * *